(12) United States Patent
Lai et al.

(10) Patent No.: US 8,253,431 B2
(45) Date of Patent: Aug. 28, 2012

(54) APPARATUS AND METHOD FOR TESTING NON-CONTACT PADS OF A SEMICONDUCTOR DEVICE TO BE TESTED

(75) Inventors: Yi-Shao Lai, Kaohsiung (TW); Tsung-Yueh Tsai, Kaohsiung (TW); Ming-Kun Chen, Kaohsiung (TW); I. L. Lin, Kaohsiung (TW); Ken Juang, Kaohsiung (TW); Ming-Hsiang Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 280 days.

(21) Appl. No.: 12/784,121

(22) Filed: May 20, 2010

(65) Prior Publication Data

US 2011/0291690 A1    Dec. 1, 2011

(51) Int. Cl.
*G01R 31/20* (2006.01)
*G01R 31/00* (2006.01)

(52) U.S. Cl. .......... 324/754.21; 324/762.01; 324/754.03
(58) Field of Classification Search .................. None
See application file for complete search history.

(56) References Cited

U.S. PATENT DOCUMENTS

| | | | |
|---|---|---|---|
| 6,586,955 B2 * | 7/2003 | Fjelstad et al. | 324/754.07 |
| 6,600,325 B2 | 7/2003 | Coates et al. | |
| 6,984,996 B2 * | 1/2006 | DiOrio et al. | 324/754.03 |

* cited by examiner

*Primary Examiner* — Jermele M Hollington
*Assistant Examiner* — Trung Nguyen
(74) *Attorney, Agent, or Firm* — McCraken & Frank LLC (57) ABSTRACT

The present invention relates to an apparatus and a method for testing non-contact pads of a semiconductor device to be tested. The apparatus includes an insulating body, at least one testing module and a plurality of probes. The insulating body includes an accommodating cavity, a lower opening and at least one side opening. The side opening communicates with the accommodating cavity and the lower opening. The testing module is disposed in the side opening, and each testing module includes a circuit board and an active chip. The active chip is disposed on and electrically connected to the circuit board. The active chip has a plurality of testing pads exposed to the accommodating cavity. The probes are disposed in the lower opening. Whereby, the non-contact pads of the semiconductor device to be tested face but not in physically contact with the testing pads of the active chip, so as to test the proximity communication between the non-contact pads of the semiconductor device and the testing pads of the active chip.

10 Claims, 7 Drawing Sheets

APPARATUS AND METHOD FOR TESTING NON-CONTACT PADS OF A SEMICONDUCTOR DEVICE TO BE TESTED

BACKGROUND OF THE INVENTION

1. Field of the Invention

The present invention relates to an apparatus and a method for testing a semiconductor device to be tested, and more particularly to an apparatus and a method for testing non-contact pads of a semiconductor device to be tested.

2. Description of the Related Art

Semiconductor devices are commonly tested before installation of a printed circuit board. A conventional apparatus for testing a semiconductor device to be tested comprises an insulating body and a plurality of terminals. The terminals are disposed one the insulating body. One end of each terminal can make the required electrical connections to the pads of leads on the semiconductor device. The semiconductor device is electrically connected directly to the printed circuit board, and capable of simulating the situation as if the semiconductor device is connected to an application circuit. This requires the semiconductor device to be placed in the test device under test conditions to allow for both testing of the semiconductor device and checking terminals connections. Given the high volume of the semiconductor devices to be tested, it is preferable if the semiconductor devices are adaptable to automation operation.

Particularly, the conventional apparatus is classified by the form of the terminals. A first conventional apparatus for testing a semiconductor device to be tested comprises an insulating body and a plurality of stamping terminals. The stamping terminals are disposed on the insulating body, and have good flexibility. The first conventional apparatus has the following disadvantages. The thickness of the stamping terminals is limited, so the apparatus has smaller conductive area and is unable to be applied to a semiconductor device having non-contact pads.

A second conventional apparatus for testing a semiconductor device to be tested comprises an insulating body and a plurality of terminals. The terminals are a plurality of probes. Each terminal comprises a spring, so that the terminals are flexible. The second conventional apparatus has the following disadvantages. The springs inside the terminals cause a larger resistance when a current flows through the terminals, so the apparatus is also unable to be applied to a semiconductor device having non-contact pads.

Therefore, it is necessary to provide an apparatus and a method for testing non-contact pads of a semiconductor device to be tested to solve the above problems.

SUMMARY OF THE INVENTION

The present invention is directed to an apparatus for testing non-contact pads of a semiconductor device to be tested. The apparatus comprises an insulating body, at least one testing module and a plurality of probes. The insulating body comprises a top surface, a bottom surface, at least one side surface, an accommodating cavity, a lower opening and at least one side opening. The bottom surface is opposite the top surface. The side surface is adjacent to the top surface and the bottom surface. The accommodating cavity opens at the top surface and is used to accommodate the semiconductor device to be tested. The lower opening opens at the bottom surface and communicates with the accommodating cavity. The side opening opens at the side surface and communicates with the accommodating cavity and the lower opening. The testing module is disposed in the side opening, and each testing module comprises a circuit board and an active chip. The circuit board is disposed in the side opening. The active chip is disposed on and electrically connected to the circuit board. The active chip has a plurality of testing pads exposed to the accommodating cavity. The probes are disposed in the lower opening. Whereby the semiconductor device to be tested is disposed in the accommodating cavity, the probes contact one surface of the semiconductor device to be tested, the non-contact pads of the semiconductor device to be tested face but not in physically contact with the testing pads of the active chip, so as to test the proximity communication between the non-contact pads of the semiconductor device and the testing pads of the active chip.

The present invention is further directed to a method for testing non-contact pads of a semiconductor device to be tested. The method comprises the following steps: (a) providing an insulating body, the insulating body comprising a top surface, a bottom surface, at least one side surface, an accommodating cavity, a lower opening and at least one side opening, wherein the bottom surface is opposite the top surface, the side surface is adjacent to the top surface and the bottom surface, the accommodating cavity opens at the top surface and is used to accommodate the semiconductor device to be tested, the lower opening opens at the bottom surface and communicates with the accommodating cavity, the side opening opens at the side surface and communicates with the accommodating cavity and the lower opening; (b) disposing a plurality of probes in the lower opening; (c) disposing at least one testing module in the at least one side opening, wherein each testing module comprises a circuit board and an active chip, the circuit board is disposed in the side opening, the active chip is disposed on and electrically connected to the circuit board, the active chip has a plurality of testing pads exposed to the accommodating cavity; and (d) disposing the semiconductor device to be tested in the accommodating cavity, wherein the probes contact one surface of the semiconductor device to be tested, the non-contact pads of the semiconductor device to be tested face but not in physically contact with the testing pads of the active chip, so as to test the proximity communication between the non-contact pads of the semiconductor device and the testing pads of the active chip.

Whereby, the apparatus of the present invention is capable for testing the proximity communication between the non-contact pads of the semiconductor device and the testing pads of the active chip, and therefore the yield rate of a package having the semiconductor device to be tested is increased.

DETAILED DESCRIPTION OF THE INVENTION

Figure 1:
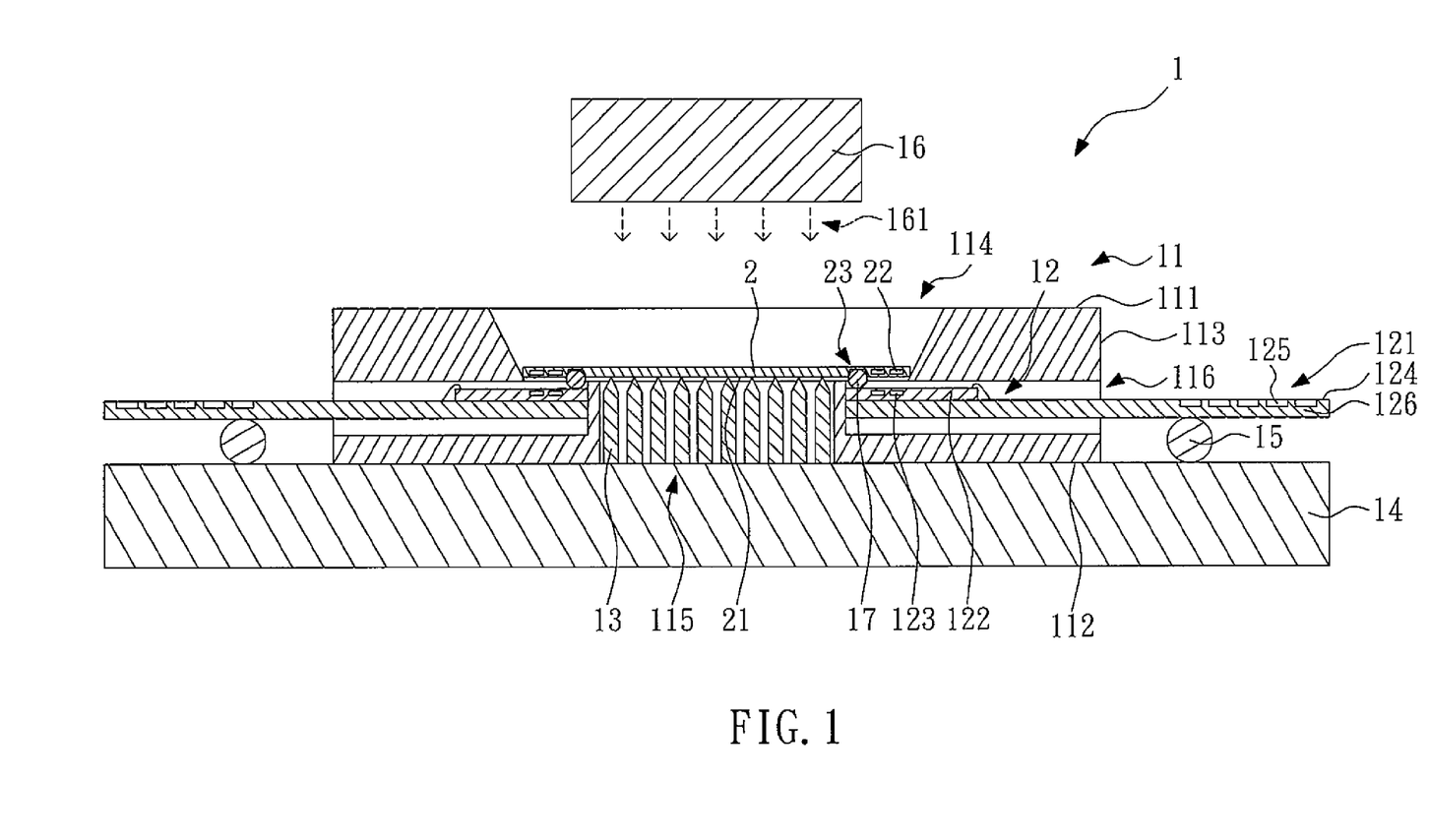
FIG. 1 is a cross-sectional view of an apparatus for testing non-contact pads of a semiconductor device to be tested according to the present invention, wherein the semiconductor device to be tested is disposed in the apparatus.

FIG. 1 shows a cross-sectional view of an apparatus for testing non-contact pads of a semiconductor device to be tested according to the present invention, wherein the semiconductor device to be tested is disposed in the apparatus. The apparatus 1 comprises an insulating body 11, at least one testing module 12 and a plurality of probes 13 such as pogo pins. In the embodiment, the apparatus 1 further comprises a substrate 14, a supporting element 15, an air pressing device 16 and at least one alignment element 17.

The insulating body 11 comprises a top surface 111, a bottom surface 112, at least one side surface 113, an accommodating cavity 114, a lower opening 115 and at least one side opening 116. The bottom surface 112 is opposite the top surface 111. The side surface 113 is adjacent to the top surface 111 and the bottom surface 112. The accommodating cavity 114 opens at the top surface 111 and is used to accommodate the semiconductor device 2 to be tested. The lower opening 115 opens at the bottom surface 112 and communicates with the accommodating cavity 114. The side opening 116 opens at the side surface 113 and communicates with the accommodating cavity 114 and the lower opening 115. In the embodiment, the cross section of the accommodating cavity 114 shrinks downward gradually so as to form a taper shape.

Figure 2:
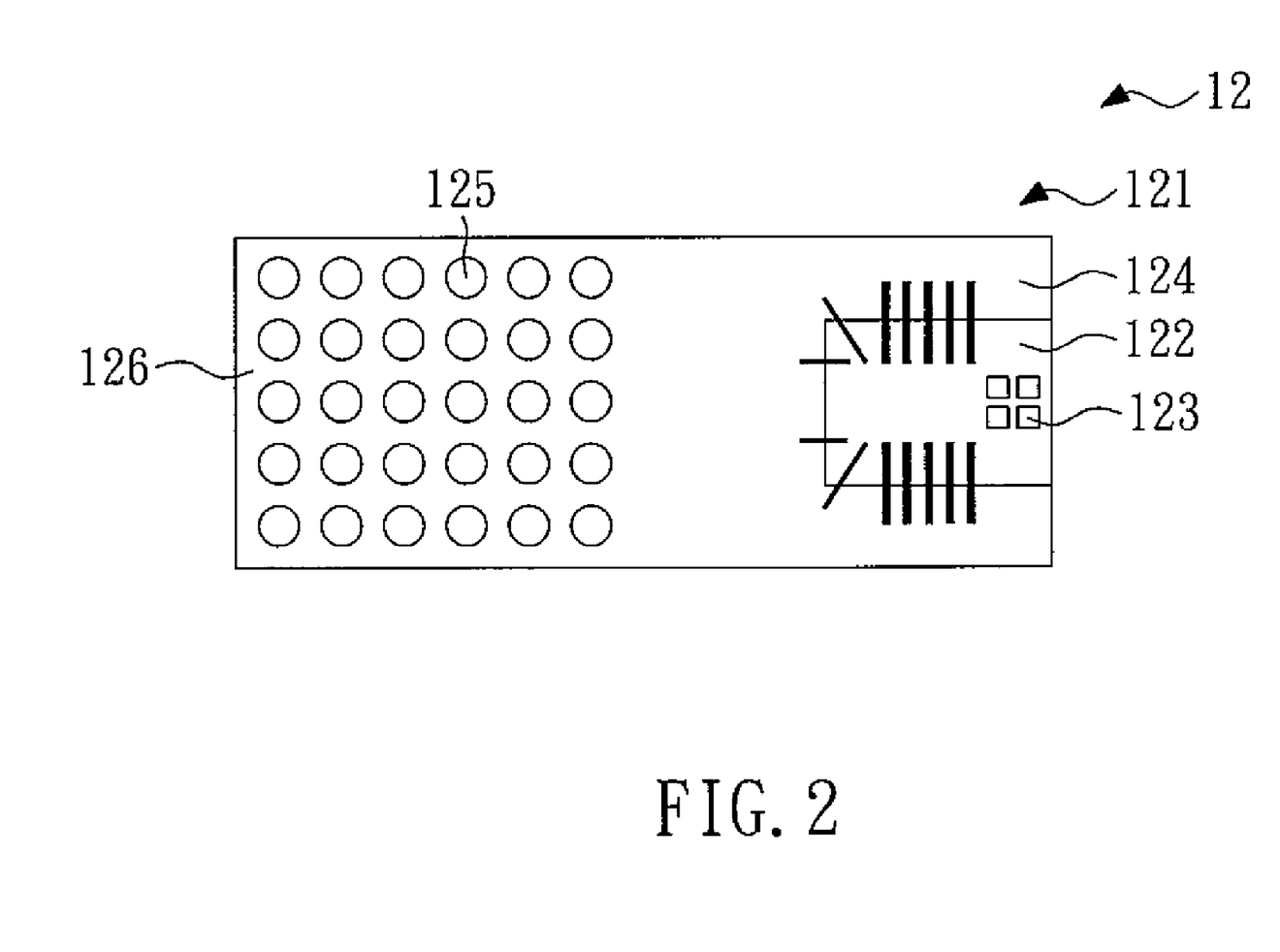
FIG. 2 is a top view of a testing module according to the present invention.

The testing module 12 is disposed in the side opening 116, and each testing module 12 comprises a circuit board 121 and an active chip 122. The circuit board 121 is disposed in the side opening 116. The active chip 122 is disposed on and electrically connected to the circuit board 121. The active chip 122 has a plurality of testing pads 123 exposed to the accommodating cavity 114. In the embodiment, the circuit board 121 comprises a receiving surface 124 and a plurality of input/output pads 125. The active chip 122 is attached on the receiving surface 124, the input/output pads 125 are electrically connected to the active chip 122. The active chip 122 is electrically connected to the circuit board 121 by wire-bonding, as shown in FIG. 2. However, in other applications, the active chip 122 can be electrically connected to the circuit board 121 by flip-chip bonding. One end 126 of the circuit board 121 extends outside the insulating body 11.

The probes 13 are disposed in the lower opening 115. The semiconductor device 2 to be tested is disposed in the accommodating cavity 114, the probes 13 contact one surface 21 of the semiconductor device 2 to be tested, the non-contact pads 22 of the semiconductor device 2 to be tested face but not in physically contact with the testing pads 123 of the active chip 122, so as to test the proximity communication between the non-contact pads 22 of the semiconductor device 2 to be tested and the testing pads 123 of the active chip 122.

The substrate 14 is electrically connected to the probes 13 and disposed below the insulating body 11. The supporting element 15 is used to support the circuit board 121 in a fixed position. The air pressing device 16 is disposed above the top surface 111 of the insulating body 11 to press the semiconductor device 2 to be tested downwardly by air flow 161. The alignment element 17 is disposed between the semiconductor device 2 to be tested and the active chip 122, and preferably, the alignment element 17 is fixed on the active chip 122, and the semiconductor device 2 to be tested further comprises at least one recess 23 to accommodate the alignment element 17.

Figure 3:
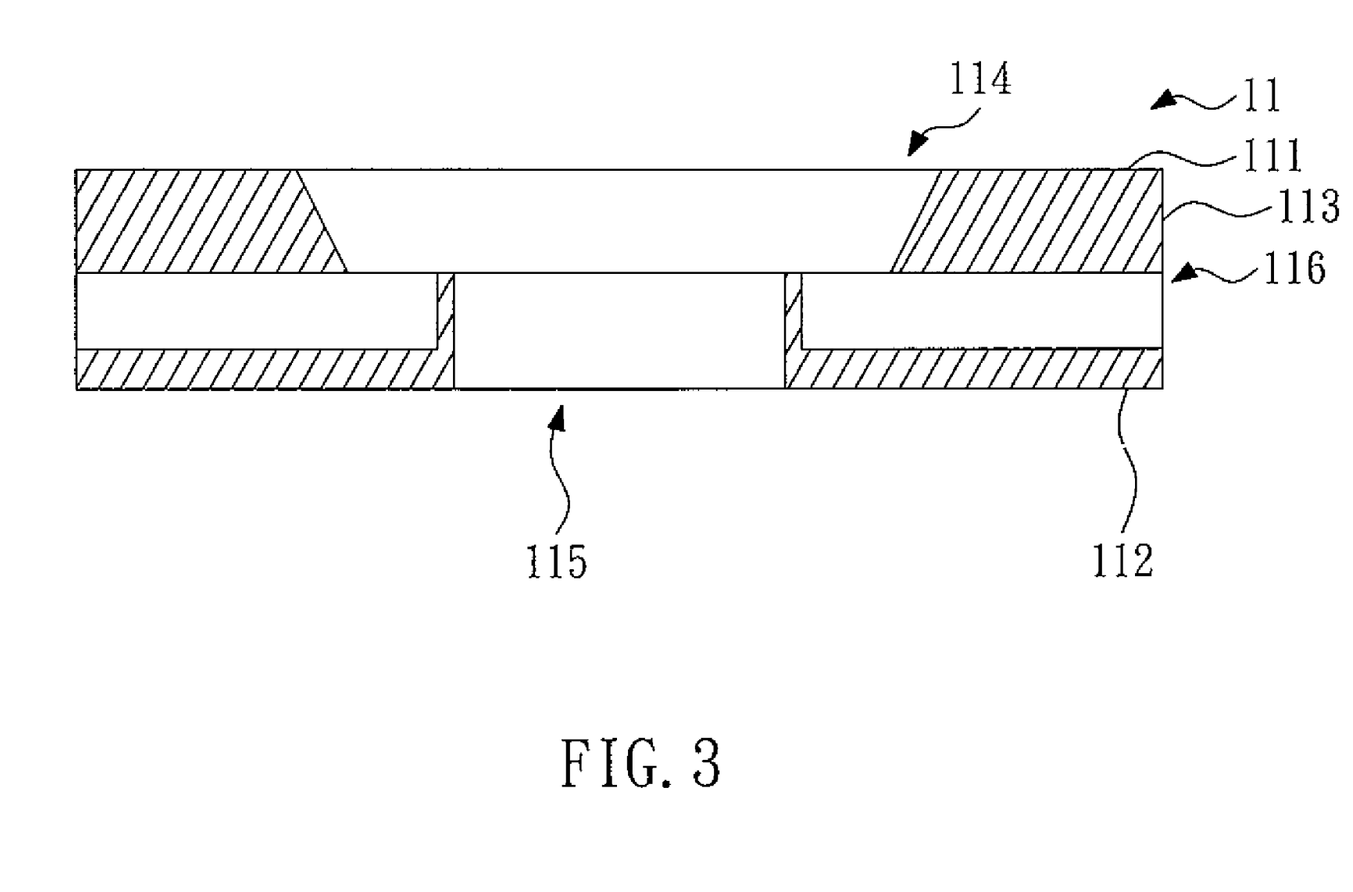
FIGS. 3 to 7 are schematic views of a method for testing non-contact pads of a semiconductor device to be tested according to the present invention.

FIGS. 3 to 7 show schematic views of a method for testing non-contact pads of a semiconductor device to be tested according to the present invention. As shown in FIG. 3, an insulating body 11 is provided. The insulating body 11 comprises a top surface 111, a bottom surface 112, at least one side surface 113, an accommodating cavity 114, a lower opening 115 and at least one side opening 116. The bottom surface 112 is opposite the top surface 111. The side surface 113 is adjacent to the top surface 111 and the bottom surface 112. The accommodating cavity 114 opens at the top surface 111 and is used to accommodate the semiconductor device 2 to be tested. The lower opening 115 opens at the bottom surface 112 and communicates with the accommodating cavity 114. The side opening 116 opens at the side surface 113 and communicates with the accommodating cavity 114 and the lower opening 115. In the embodiment, the cross section of the accommodating cavity 114 shrinks downward gradually so as to form a taper shape.

Figure 4:
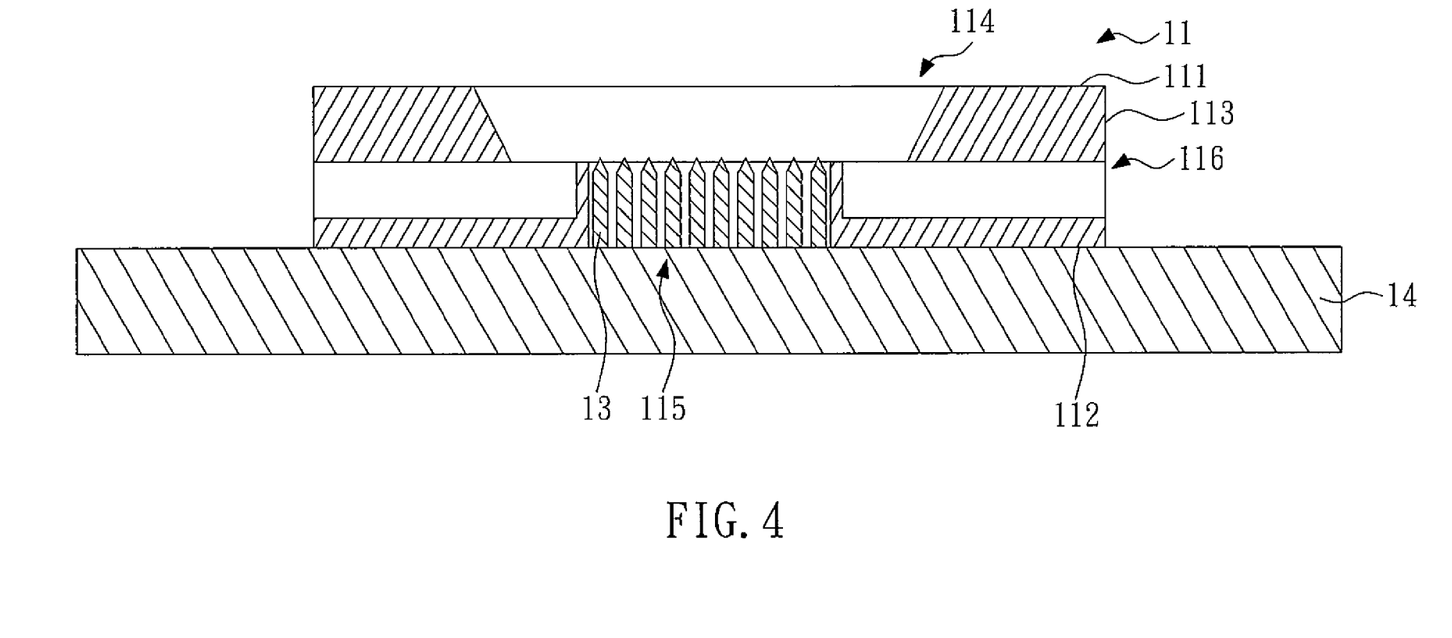

As shown in FIG. 4, a plurality of probes 13 is disposed in the lower opening 115. In the embodiment, the method further comprises a step of providing a substrate 14. The substrate 14 is electrically connected to the probes 13 and disposed below the insulating body 11.

Figure 5:
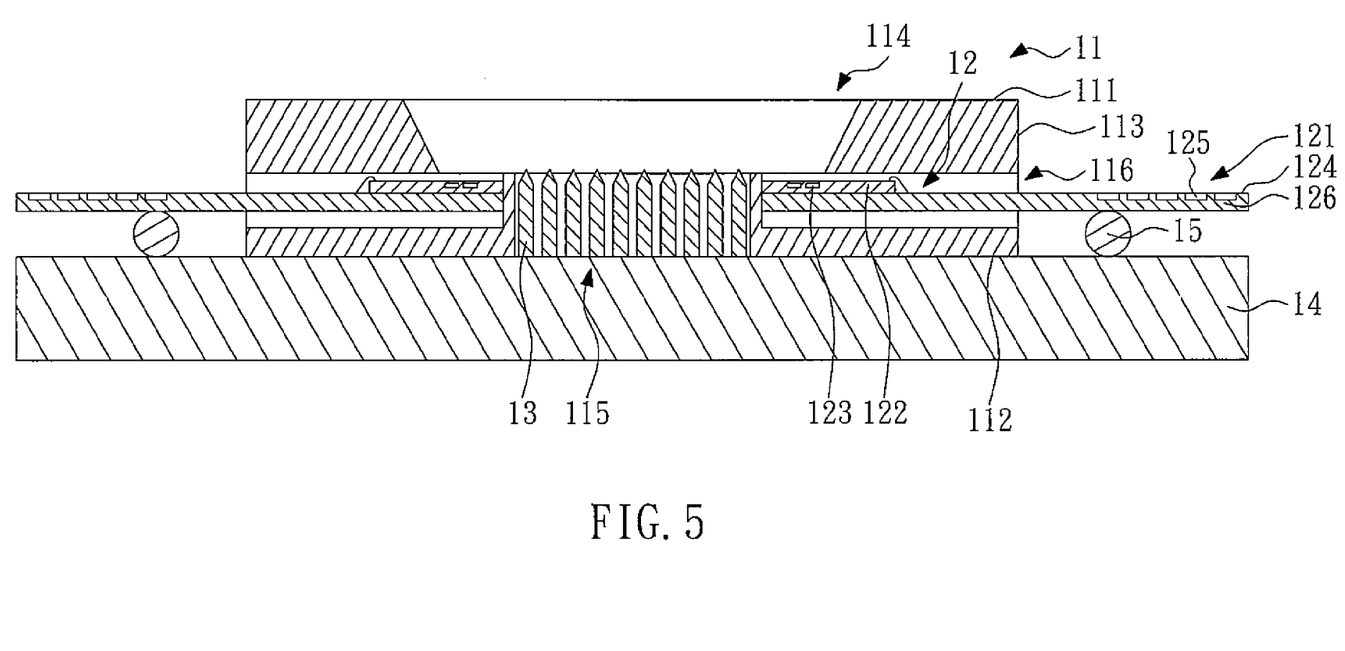

As shown in FIG. 5, at least one testing module 12 is disposed in the at least one side opening 116. Each testing module 12 comprises a circuit board 121 and an active chip 122. The circuit board 121 is disposed in the side opening 116. The active chip 122 is disposed on and electrically connected to the circuit board 121. The active chip 122 has a plurality of testing pads 123 exposed to the accommodating cavity 114. In the embodiment, the circuit board 121 comprises a receiving surface 124 and a plurality of input/output pads 125. The active chip 122 is attached on the receiving surface 124, the input/output pads 125 are electrically connected to the active chip 122. The active chip 122 is electrically connected to the circuit board 121 by wire-bonding or flip-chip bonding. One end 126 of the circuit board 121 extends outside the insulating body 11. The method further comprises a step of disposing a supporting element 15 to support the circuit board 121 in a fixed position.

Figure 6:
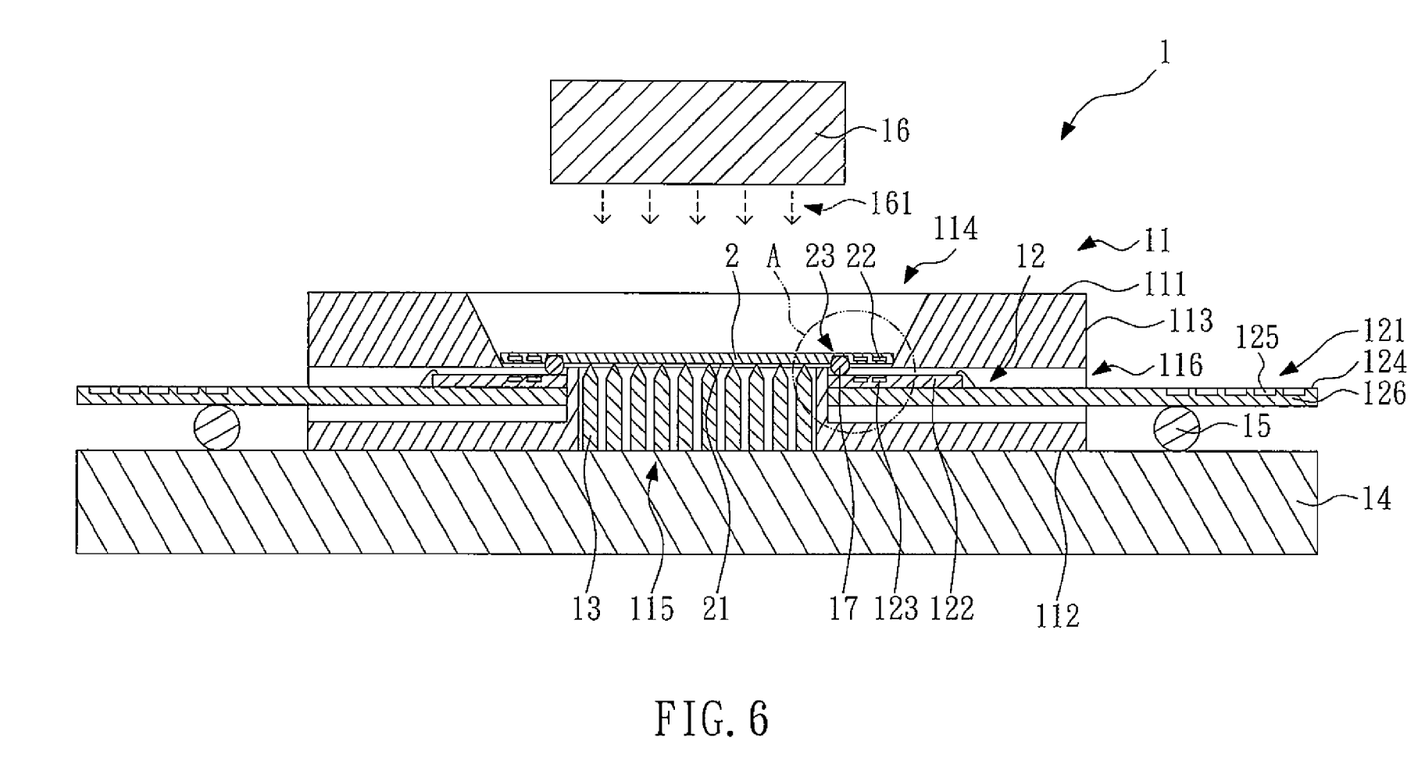

As shown in FIG. 6, the semiconductor device 2 to be tested is disposed in the accommodating cavity 114. The probes 13 contact one surface 21 of the semiconductor device 2 to be tested. The non-contact pads 22 of the semiconductor device 2 to be tested face but not in physically contact with the testing pads 123 of the active chip 122, so as to test the proximity communication between the non-contact pads 22 of the semiconductor device 2 to be tested and the testing pads 123 of the active chip 122.

In the embodiment, the method further comprises a step of operating an air pressing device 16 and providing at least one alignment element 17. The air pressing device 16 is disposed above the top surface 111 of the insulating body 11 to press the semiconductor device 2 to be tested downwardly by air flow 161. The alignment element 17 is disposed between the semiconductor device 2 to be tested and the active chip 122, so that the position of the semiconductor device 2 to be tested is aligned by the alignment element, and preferably, the alignment element 17 is fixed on the active chip 122, and the semiconductor device 2 to be tested further comprises at least one recess 23 to accommodate the alignment element 17.

Figure 7:
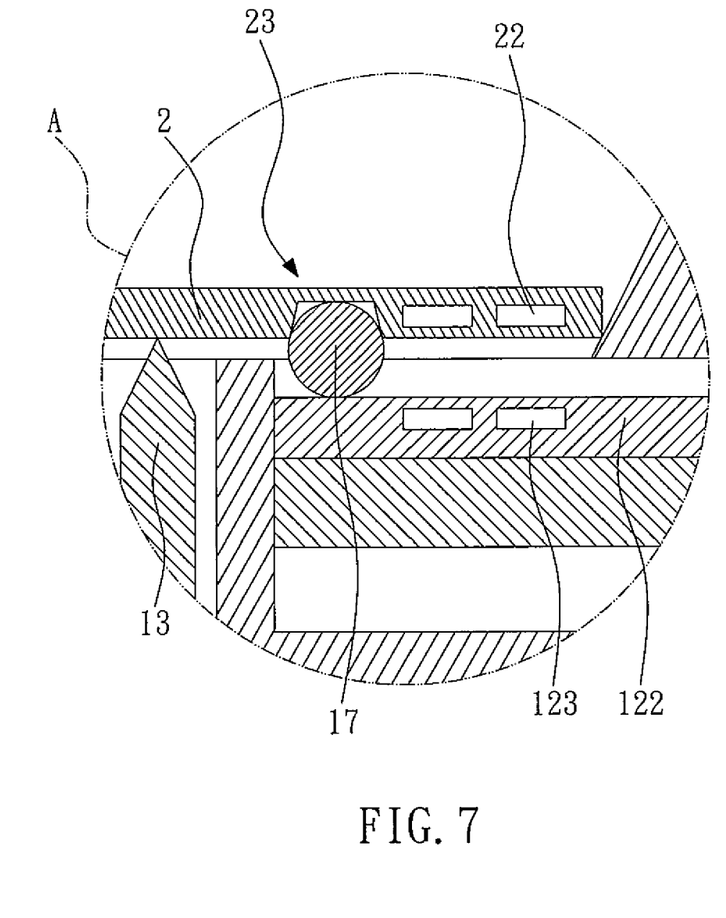

FIG. 7 shows a partially enlarged cross-sectional view of area A of FIG. 6. In order to achieve the function of proximity communication, part of the semiconductor device 2 to be tested and the active semiconductor device 122 are placed face-to-face in a manner that the transmitter circuit of the semiconductor device 2 to be tested is aligned with the receiver circuit of the active semiconductor device 122 in extremely close proximity, for example, with only microns of separation between them. The signals between the transmitter circuit and the receiver circuit may be transmitted by inductive or capacitive coupling with low overall communication cost.

Take transmission by capacitive coupling for example. The non-contact pads 22 of the semiconductor device 2 to be tested and the testing pads 123 of the active semiconductor device 122 are aligned with each other. Since the non-contact pads 22 and the testing pads 123 are not in physical contact with each other, there are capacitances between the non-contact pads 22 of the semiconductor device 2 to be tested and the testing pads 123 of the active semiconductor device 122. It is this capacitive coupling that provides signal paths between the semiconductor device 2 to be tested and the active semiconductor device 122. Changes in the electrical potential of the surface metal of a signal pad cause corresponding changes in the electrical potential of the metal comprising the corresponding signal pad. Suitable drivers of the transmitter circuit and sensing circuits of the receiver circuit in the respective semiconductor device make communication through this small capacitance possible. In the embodiment, each testing pad 123 is electrically connected to a sensing amplifier build in the active semiconductor device 122.

Whereby, the apparatus 1 of the present invention is capable for testing the proximity communication between the non-contact pads 22 of the semiconductor device 2 to be tested and the testing pads 123 of the active chip 122, and therefore the yield rate of a package having the semiconductor device 2 to be tested is increased.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. An apparatus for testing non-contact pads of a semiconductor device to be tested, comprising:
   an insulating body, comprising:
      a top surface;
      a bottom surface, opposite the top surface;
      at least one side surface, adjacent to the top surface and the bottom surface;
      an accommodating cavity, opening at the top surface and used to accommodate the semiconductor device to be tested;
      a lower opening, opening at the bottom surface and communicating with the accommodating cavity; and
      at least one side opening, opening at the side surface and communicating with the accommodating cavity and the lower opening;
   at least one testing module, disposed in the side opening, each testing module comprising:
      a circuit board, disposed in the side opening; and
      an active chip, disposed on and electrically connected to the circuit board, the active chip having a plurality of testing pads exposed to the accommodating cavity; and
   a plurality of probes, disposed in the lower opening;
   whereby the semiconductor device to be tested is disposed in the accommodating cavity, the probes contact one surface of the semiconductor device to be tested, the non-contact pads of the semiconductor device to be tested face but not in physically contact with the testing pads of the active chip, so as to test the proximity communication between the non-contact pads of the semiconductor device to be tested and the testing pads of the active chip.

2. The apparatus as claimed in claim 1, wherein the cross section of the accommodating cavity shrinks downward gradually so as to form a taper shape.

3. The apparatus as claimed in claim 1, wherein the circuit board comprises a receiving surface and a plurality of input/output pads, the active chip is attached on the receiving surface, the input/output pads are electrically connected to the active chip.

4. The apparatus as claimed in claim 1, wherein the active chip is electrically connected to the circuit board by wire-bonding or flip-chip bonding.

5. The apparatus as claimed in claim 1, wherein one end of the circuit board extends outside the insulating body.

6. The apparatus as claimed in claim 1, further comprising a substrate electrically connected to the probes and disposed below the insulating body.

7. The apparatus as claimed in claim 1, further comprising a supporting element to support the circuit board in a fixed position.

8. The apparatus as claimed in claim 1, further comprising an air pressing device disposed above the top surface of the insulating body to press the semiconductor device to be tested downwardly by air flow.

9. The apparatus as claimed in claim 1, further comprising at least one alignment element disposed between the semiconductor device to be tested and the active chip.

10. The apparatus as claimed in claim 9, wherein the alignment element is fixed on the active chip, and the semiconductor device to be tested further comprises at least one recess to accommodate the alignment element.

* * * * *